(12) United States Patent
Eisenstadt et al.

(10) Patent No.: US 7,924,025 B2
(45) Date of Patent: Apr. 12, 2011

(54) SYSTEM, DEVICE, AND METHOD FOR EMBEDDED S-PARAMETER MEASUREMENT

(75) Inventors: William R. Eisenstadt, Gainesville, FL (US); Robert M. Fox, Gainesville, FL (US); Jang Sup Yoon, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 440 days.

(21) Appl. No.: 11/996,913

(22) PCT Filed: Jul. 25, 2006

(86) PCT No.: PCT/US2006/029048
§ 371 (c)(1),
(2), (4) Date: Jan. 25, 2008

(87) PCT Pub. No.: WO2007/014280
PCT Pub. Date: Feb. 1, 2007

(65) Prior Publication Data
US 2008/0191712 A1   Aug. 14, 2008

Related U.S. Application Data

(60) Provisional application No. 60/702,126, filed on Jul. 25, 2005.

(51) Int. Cl.
*G01R 27/02* (2006.01)
*G01R 27/32* (2006.01)
(52) U.S. Cl. .................. 324/638; 324/601; 702/85
(58) Field of Classification Search ............ 324/638
See application file for complete search history.

(56) References Cited

U.S. PATENT DOCUMENTS

| | | | |
|---|---|---|---|
| 4,777,429 A * | 10/1988 | Potter | 324/638 |
| 5,050,107 A * | 9/1991 | Cannon et al. | 358/1.3 |
| 5,524,281 A | 6/1996 | Bradley et al. | |
| 6,417,674 B1 * | 7/2002 | Rowell et al. | 324/601 |
| 6,421,624 B1 * | 7/2002 | Nakayama et al. | 702/117 |
| 7,061,251 B2 * | 6/2006 | Taylor et al. | 324/534 |
| 7,359,814 B1 * | 4/2008 | Nakayama et al. | 702/85 |
| 2003/0231311 A1 * | 12/2003 | Tucker | 356/364 |
| 2004/0138838 A1 * | 7/2004 | Scheiner et al. | 702/64 |
| 2004/0153265 A1 | 8/2004 | Martens et al. | |
| 2004/0257092 A1 * | 12/2004 | Verspecht | 324/638 |
| 2005/0194981 A1 * | 9/2005 | Cole | 324/615 |

\* cited by examiner

*Primary Examiner* — Timothy J Dole
*Assistant Examiner* — John Zhu
(74) *Attorney, Agent, or Firm* — Saliwanchik, Lloyd & Eisenschenk

(57) ABSTRACT

An embedded s-parameter measurement system for measuring or determining an s-parameter is provided. The system includes an s-parameter test circuit for connecting to a port of a high-frequency multi-port device-under-test (DUT). The s-parameter test circuit includes a directional coupler for sampling a forward signal conveyed to the DUT and for sampling a reverse signal reflected by the DUT. The s-parameter test circuit also includes a peak detector electrically connected to the directional coupler for detecting a magnitude of a signal conveyed to the peak detector by the directional coupler. The s-parameter test circuit further includes a phase detector electrically connected to the directional coupler for determining a phase of a signal conveyed to the phase detector by the directional coupler, and at least one other s-parameter test circuit for connecting to another port of the high-frequency multi-port DUT.

24 Claims, 14 Drawing Sheets

SYSTEM, DEVICE, AND METHOD FOR EMBEDDED S-PARAMETER MEASUREMENT

CROSS-REFERENCE TO RELATED APPLICATIONS

This application is a §371 national stage entry of International Application No. PCT/US2006/029048, filed Jul. 25, 2006, which claims the benefit of U.S. Provisional Application No. 60/702,126, filed Jul. 25, 2005, both of which are hereby incorporated by reference.

The subject invention was made with government support under Grant No. 0325340 awarded by the National Science Foundation. The government has certain rights in the invention.

FIELD OF THE INVENTION

The present invention is related to the field of electronic circuits, and, more particularly, to the testing of electronic circuits.

BACKGROUND

The performance of a microwave or other high-frequency integrated circuit (IC) can be verified using various testing techniques. In most instances, however, the preferred technique is to obtain measurements with a vector network analyzer. A vector network analyzer yields the complex impedance of an IC or other circuit at a given frequency, measuring the amplitude and phase difference between a network response signal and a reference signal. The amplitude and phase difference are key measurements for verifying the form of the particular transfer function that characterizes a specific RF/microwave circuit or system. The information provided by the vector network analyzer measurements can be used, for example, for precision calibration of the microwave test setup without the confounding effects typically introduced as a result of the parasitic effects induced by test cables, connectors, or from other sources of error in a microwave test system.

The testing and verification of high-frequency ICs typically involves small-signal characterization of RF and/or microwave components of the circuit or system. There is fairly wide-spread agreement that a preferred small-signal characterization of RF and microwave components is the one that is based on scattering parameters, typically referred to as s-parameters. The s-parameters comprise a set of parameters that describe the scattering and reflection of traveling electromagnetic (em) waves that occur, for example, when a network is inserted into a transmission line. The s-parameters are typically used to characterize high-frequency networks, especially because simpler models that are valid at lower frequencies are usually inadequate in the case of high-frequency networks. The s-parameters are normally measured as a function of frequency, the measurement representing a complex gain (i.e., magnitude and/or phase). Accordingly, s-parameters are often termed complex scattering parameters. The resulting measurement is typically in decibels 20 log(Sij) since s-parameters are voltage ratios of the corresponding electromagnetic power waves.

The s-parameters can be used to accurately describe the electronic behavior of a device under linear conditions in the microwave frequency range. Typically, s-parameters are measured in 50 ohm transmission systems and require no opens or shorts in order to be connected with a device-under-test (DUT). The testing of an IC or other system ordinarily is accomplished by attaching to a vector network analyzer an s-parameter measurement unit that provides for microwave signal switching, sampling, and load-terminating.

Conventional techniques for determining the s-parameters typically require 1) a system calibration activity and 2) a direct, accurate measurement, followed by 3) a device measurement extraction, device calibration or other "de-embedding procedure"—typically implemented in a software-based module. This third activity is typically critical for removing the testing fixture characteristics from the overall measurement. The calibration procedure measures known precision standards and extracts an "error model" to represent the magnitude and phase errors in the test equipment and the connections to the DUT. When the electronic response of the DUT is measured, the "raw data" obtained is adjusted by subtracting the effects of the test equipment, thereby "de-embedding" the true device data by subtracting out the effects of the error model.

Various attempts have been made over the years to reduce the costs associated with such testing procedures and techniques. Notwithstanding these attempts, however, there remains a need for an effective and efficient on-chip embedded test technique that can obviate the parasitic effects that are inevitably caused by contact pads and related interactions between pads, RF probes, and RF cables that connect to the necessary test equipment. Without an effective and efficient on-chip embedded test technique, complex calibration procedures are typically required in order to factor out the effect of unwanted parasitic circuit elements. So, too, without an effective and efficient on-chip embedded test technique, test equipment with high precision as well as a wide dynamic range—and, accordingly, involving significant costs—is needed to measure RF/microwave performance and attain a proper calibration.

SUMMARY OF THE INVENTION

The present invention provides a system, device, and related methods for effectively and efficiently determining s-parameters. More particularly, the present invention provides for a system, device, and related methods for embedded s-parameter determinations or measurements associated with a high-frequency IC or other circuit. The embedded s-parameter determinations obtained with the present invention can have high precision and can encompass a wide dynamic range. The embedded device of the present invention, moreover, can obviate the need for cables and connectors, and thus can be implemented using relatively small amounts of the "real estate" available on a typical semiconductor chip. The system, device, and methods of the present invention effect significant savings in terms of cost and time in comparison to conventional systems, devices, and techniques.

One embodiment of the present invention is an embedded s-parameter measurement system for measuring or determining an s-parameter. The embedded s-parameter measurement system can include an s-parameter test circuit that connects to one port of a multi-port, high-frequency device-under-test (DUT). The system further can include at least one other s-parameter test circuit that connects to another of the multiple ports of the DUT.

The s-parameter test circuit, more particularly, can include a directional coupler for sampling a signal conveyed to or from the DUT and for sampling a reverse signal reflected by the DUT. Additionally, the s-parameter test circuit can include a peak detector electrically connected to the directional coupler for detecting the magnitude of a signal conveyed to the peak detector by the directional coupler. The s-parameter test circuit can further include a phase detector electrically connected to the directional coupler for determining the phase of a signal conveyed to the phase detector by the directional coupler.

Another embodiment of the present invention is a method for determining or measuring an s-parameter. The method can include sampling a portion of a signal conveyed to a device-under-test (DUT) and conveying the sampled portion of the signal to a peak detector and a phase detector. Additionally, the method can include sampling at least a signal conveyed from the DUT and/or a signal reflected by the DUT. The method further can include conveying the sampled portion of the signal conveyed from the DUT when the signal is conveyed from the DUT and sampled, and conveying the sampled portion of the signal reflected by the DUT when the signal is reflected by the DUT.

BRIEF DESCRIPTION OF THE DRAWINGS

There are shown in the drawings, embodiments which are presently preferred. It is explicitly noted, however, that the invention is not limited to the precise arrangements and instrumentalities shown.

DETAILED DESCRIPTION

Figure 1:
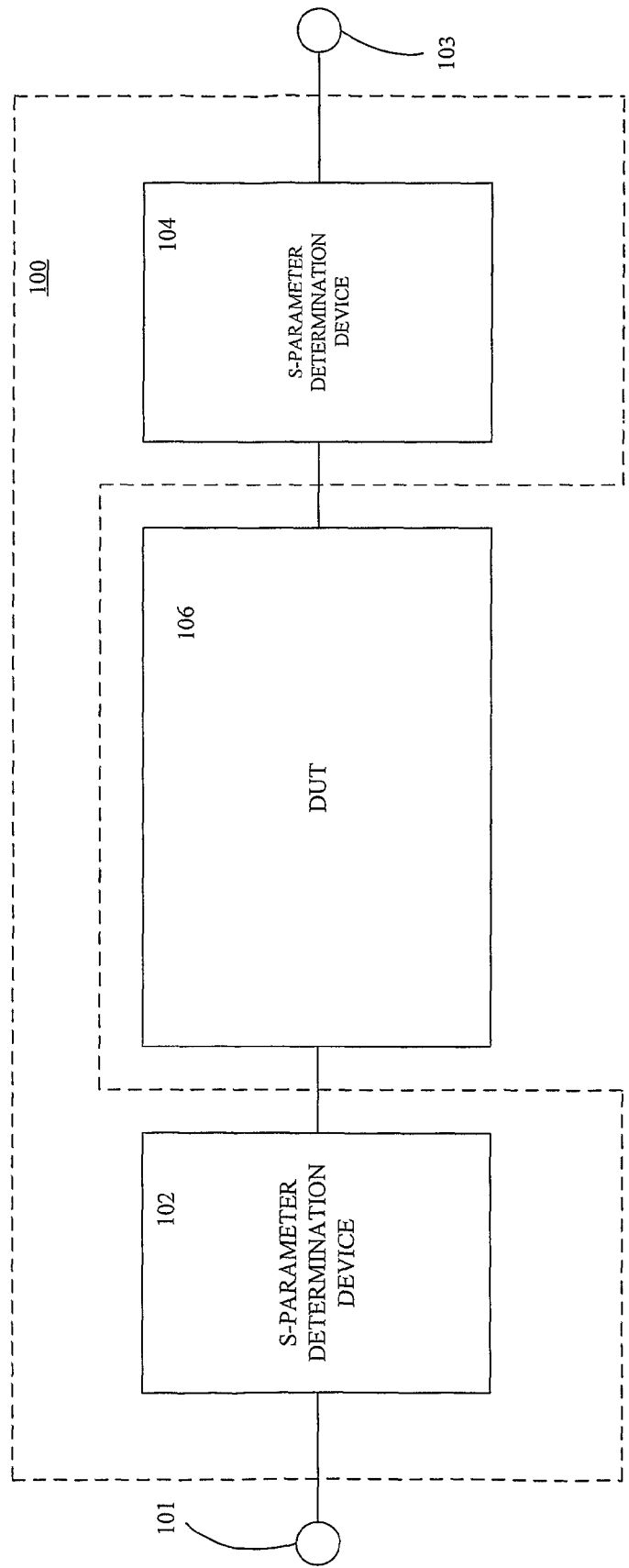
FIG. 1 is a schematic diagram of a system for effecting embedded s-parameter measurements, according to one embodiment of the present invention.

FIG. 1 is a schematic diagram of a system 100 for obtaining an s-parameter measurement, according to one embodiment of the invention. As illustrated, the system 100 includes a first device 102 defining a first s-parameter test circuit along with a second device 104 defining a second s-parameter test circuit. Each device 102, 104 illustratively connects electrically to a different port of a device-under-test (DUT) 106. The exemplary DUT 106 illustratively comprises a two-port device. It will be apparent from the ensuing discussion, however, that the system 100 can be expanded to connect to additional ports of a DUT having more than two ports. Although the structure and functionality of the system 100 are described herein in the context of an exemplary two-port DUT, this is merely for ease of understanding without any loss of generality; the structure and functionality of an alternative embodiment in which the system 100 operates with a DUT having more than two ports will be clearly understood from the description. It will be equally apparent from the description that the system 100, as described, can be expanded in order to operate it in connection with a DUT having more than two ports.

Illustratively, the first device 102 electrically connects to one of the two ports of the exemplary DUT 106, while the second device 104 connects to the other of the two ports of the DUT. Thus, as shown, the first device 102 connects to the first port 101 of the DUT 106, and the second device 104 connects to the second port 103. The first and second devices 102, 104, which as already noted define s-parameter test circuits, determine for the exemplary two-port DUT 106 a standard set of four s-parameters designated $S_{11}$, $S_{12}$, $S_{21}$ and $S_{22}$. As will readily understood by one of ordinary skill in the art, the s-parameters characterize a gain of the DUT 106.

Consistent with long-standing convention, the subscripts of the respective s-parameters denote the port numbers of the DUT 106. For example, the ratio of the output of the second port 103 to an incident signal at the first port 101 is designated $S_{21}$. With respect to a reflected signal, a signal is received at and reflected back from the same port. Accordingly, the s-parameter for an input reflection is designated $S_{11}$. More particularly, if the first port 101 defines an input port and the second port 103 defines an output port, then $S_{11}$ denotes the input reflection coefficient of the input and $S_{22}$ denotes the output reflection coefficient of the output. $S_{21}$ designates a forward transmission coefficient from input to output, and $S_{12}$ designates a reverse transmission coefficient from output to input.

Figure 2A:
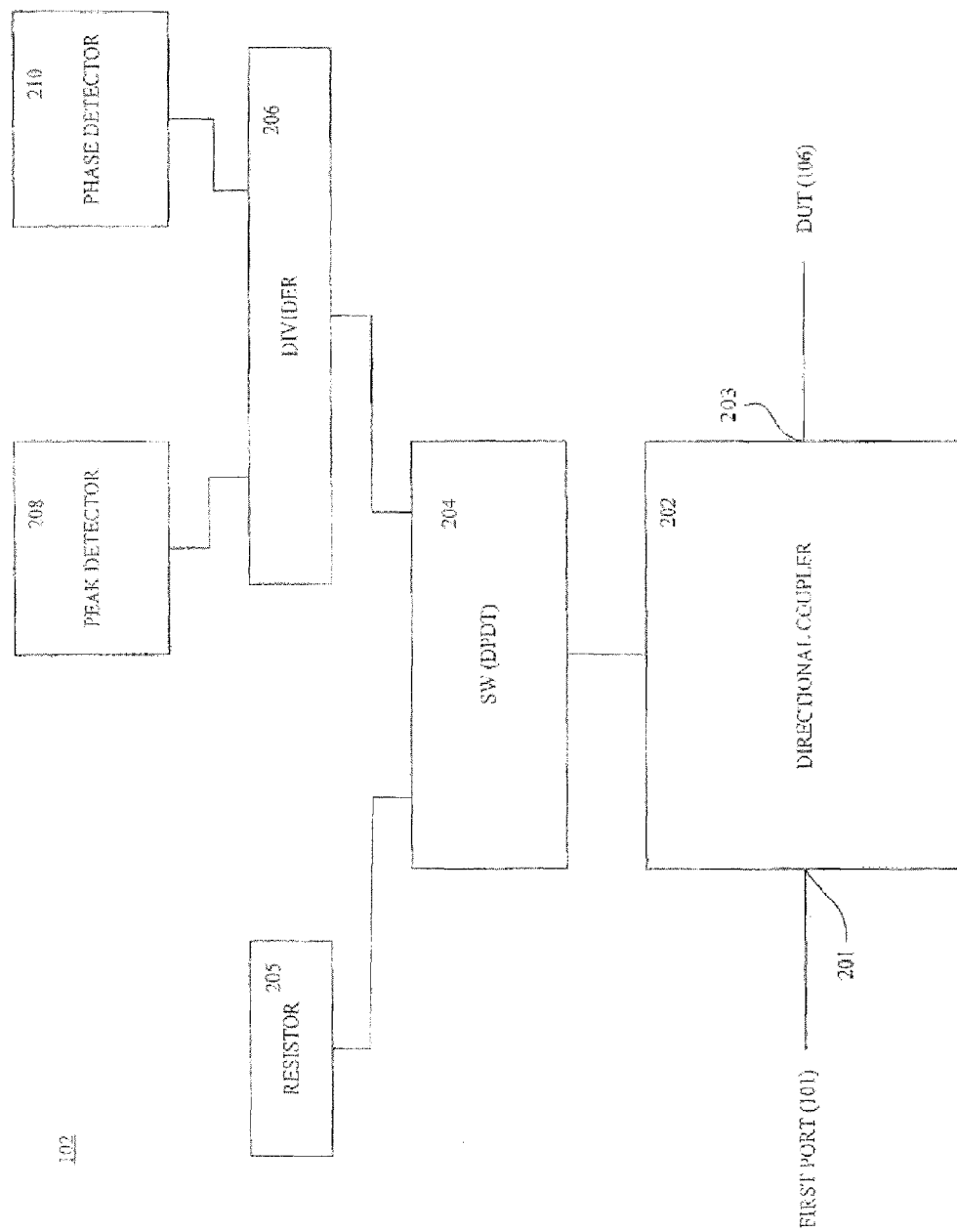
FIGS. 2A and 2B are schematic diagrams of an s-parameter test circuit, according to other embodiments of the present invention.

Referring additionally now to FIG. 2A, the components of a device 102 defining an s-parameter test circuit, according to another embodiment of the present invention, are schematically illustrated. The device 102 illustratively includes a directional coupler 202 and, electrically connected to the directional coupler, a switch 204. The switch 204 can be implemented in different forms—such as the exemplary double pole, double throw (DPDT) switch illustrated—for alternately opening and closing connections between two conductors of the circuit. Illustratively, the switch 204 electrically connects to a resistor 205. The resistor can be, for example, a 50 ohm resistor. The switch 204 also connects electrically to a divider 206. The divider 206, in turn, illustratively connects to a peak detector 208 and to a phase detector 210.

The functionality of the system 100 is exemplified by the system's determination of the reflection coefficient Operatively, the system 100 determines the reflection coefficient $S_{11}$ in the following manner. A signal is received at the first port 101 of the DUT 106 and is passed by the directional coupler 202 in a forward direction to the DUT 106. A small portion of the signal is sampled by the directional coupler 202 at a forward coupling port 201 of the directional coupler, the forward coupling port being illustratively connected to the first port 101 of the DUT 106. The sampled portion of the signal is conveyed by the directional coupler 202 to the divider 206 via the switch 204. From the divider 206, the sampled portion of the signal is conveyed to the peak detector 208 and to the phase detector 210.

Owing to a mismatching of impedances, another portion of the signal is reflected back in a reverse direction (i.e., opposite the illustrated forward direction) and travels from the DUT 106 back to the directional coupler 202. The reflected portion of the signal defines a reverse signal that is sampled by the directional coupler 202 when it is received at a reverse coupling port 203 of the directional coupler. The reverse signal is directed from the directional coupler 202 to the divider 206 via the switch 204. From the divider 206, the reverse signal is conveyed to the peak detector 208 and to the phase detector 210. The peak detector 208 determines the magnitude of each signal, and the phase detector 210 determines the phase of each signal. The measured values for the reverse signal are compared to the corresponding ones of the initial signal in order to compute the s-parameter. Note that with respect to both signals, the magnitude and phase of each is measured or determined directly at RF or microwave frequencies, or, alternatively, down converted to lower frequencies in the detectors for determination.

The other s-parameters can be determined or measured similarly. The second device 104 of the system 100, more particularly, measures the output reflection coefficient $S_{22}$ in the same manner that the first device 102 measures the input reflection coefficient $S_{11}$. The second device 104 can be identical to the first device 102 save for it being connected between the DUT 106 and the second port 103; that is, the second device can identically include a directional coupler, a switch, a resistor, and a divider connected to both a divider and a phase detector. Each of the various components of the second device 104 can be arranged as illustrated with respect to the first device 102. Thus, the second device 104 can measure the output reflection coefficient $S_{22}$ in the same manner in which the first device 102 measures the input reflection coefficient $S_{11}$.

The first and second devices 102, 104 cooperate in measuring the other two s-parameters. To measure the forward transmission coefficient $S_{21}$, an input signal is received at the first port 101 of the DUT 106 and is passed by the directional coupler 202 in a forward direction to the DUT 106. A small portion of the signal is sampled by the directional coupler 202 at a forward coupling port 201 of the directional coupler. The sampled portion of the signal is conveyed by the directional coupler 202 to the divider 206 via the switch 204. From the divider 206, the sampled portion of the signal is conveyed to the peak detector 208 and to the phase detector 210. The output signal generated by the DUT 106 in response to the input signal is sampled by the directional coupler of the second device 104 and conveyed through the switch of the second device to the divider. The sampled signal is divided and the divided signals conveyed to the peak detector and phase detector of the second device. The measured peak and phase can be used in conjunction with the similar measures taken by the first device 102 to generate a measurement of the forward transmission coefficient $S_{21}$. The first and second devices 102, 104 can cooperate to perform the reverse process, thereby yielding a measurement of the reverse transmission coefficient $S_{12}$.

In contrast to conventional analyzers and techniques for measuring or determining s-parameters, the system 100 of the present invention obviates the need for a high-accuracy low oscillator (LO), typically needed in conventional devices. The system 100 also eliminates the parasitic effects that would otherwise arise with a conventional probe pad and line connecting the pad to the DUT. Accordingly, the system 100 attains the sensitivity of conventional analyzers over a wide dynamic range, but does so without the concomitant expenses typically associated with conventional analyzers. By eliminating the need for pads, cables, and connectors, moreover, the system 100 is able to achieve this sensitivity over a wide dynamic range while occupying less of the real estate of a conventional semiconductor chip when implemented with an IC as an "on-chip" system.

Figure 2B:
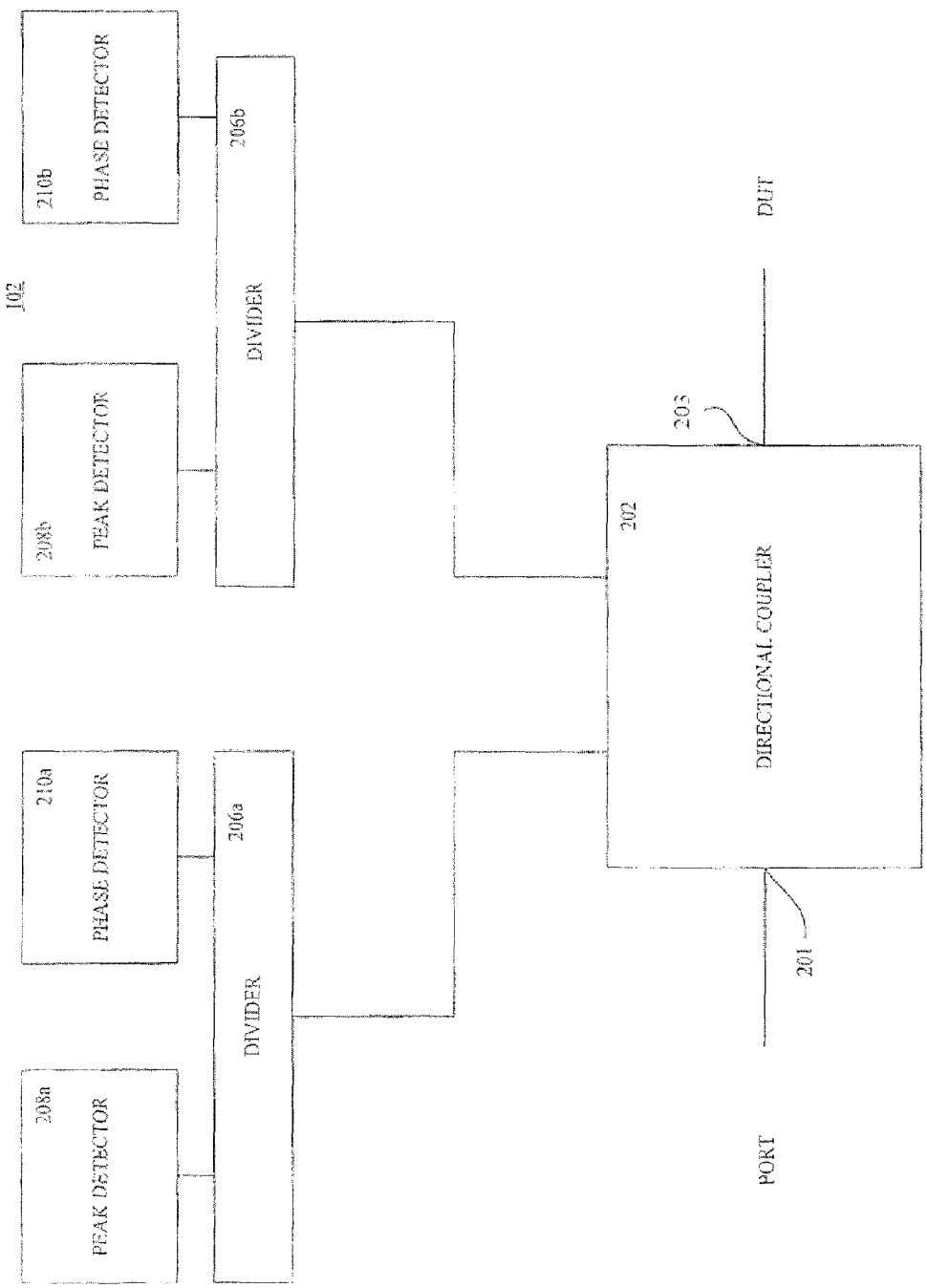

FIG. 2B schematically illustrates another embodiment of an s-parameter test circuit, according the present invention. It also illustratively includes a directional coupler 202. In contrast to the previously described device, however, the s-parameter circuit according to this embodiment includes at least one additional divider, along with additional peak and phase detectors connected thereto, in lieu of a resistor and a switch. Thus, illustratively, the directional coupler 202 electrically connects to a first divider 206a, which in turn, illustratively connects to a first peak detector 208a and to a first phase detector 210a. Illustratively, at least one additional divider 206b also electrically connects to the directional coupler 202. One additional peak detector 208b and one additional phase detector 210b connect to the at least one additional divider 206b.

Figure 3:
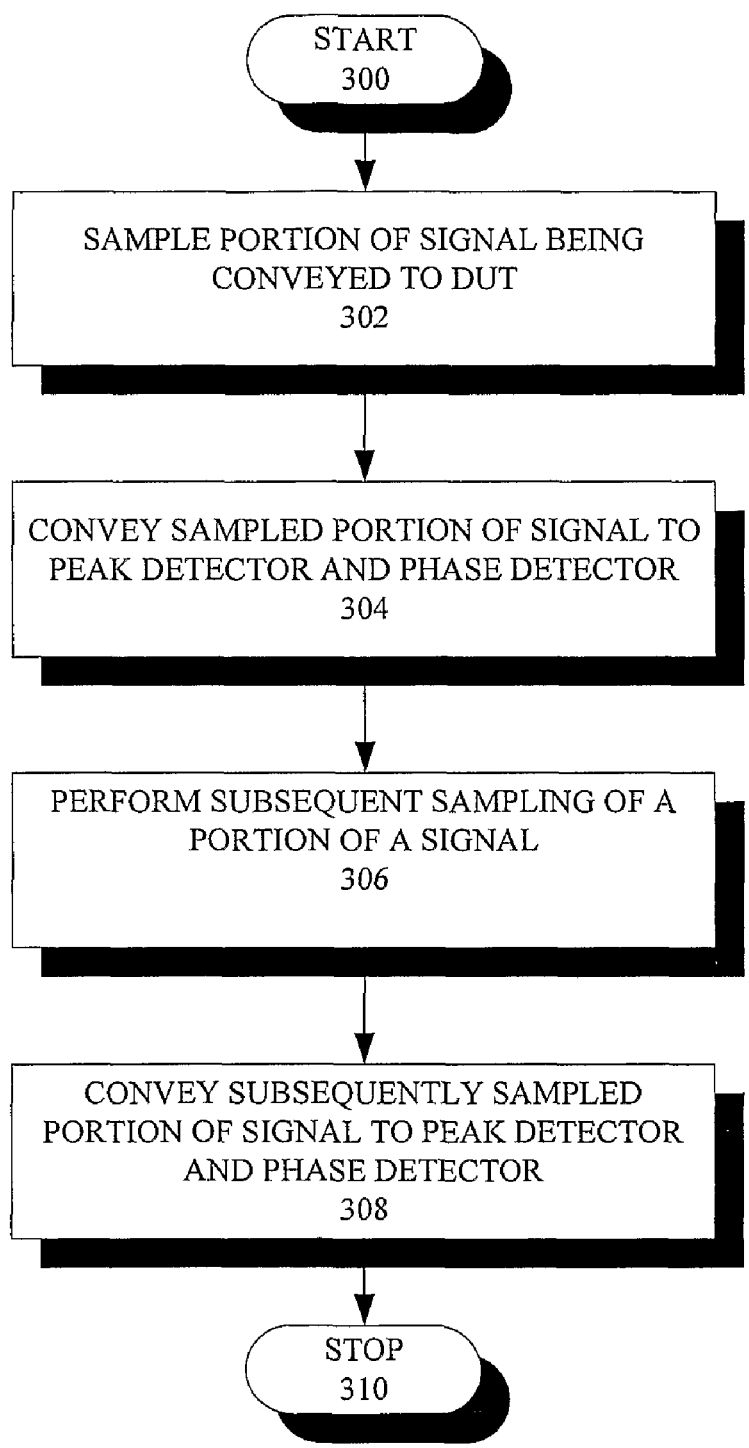
FIG. 3 a flowchart illustrating exemplary steps of a method for determining the s-parameters associated with a device-under-test, according to still another embodiment of the present invention.

FIG. 3 provides a flowchart of the exemplary steps of a method for measuring or determining an s-parameter, according to another embodiment of the present invention. The method illustratively includes, at step 302, sampling a portion of a signal conveyed to a DUT, and conveying the sampled portion of the signal to both a peak detector and a phase detector at step 304. Subsequently, at step 306, another sampling of a portion of a signal is performed. The signal can comprise a signal reflected back from the DUT or conveyed from the DUT. Whatever the nature of the signal, the portion of the subsequently sampled signal is likewise conveyed to a peak detector and a phase detector at step 308. The method illustratively concludes at step 310.

As already noted above, each s-parameter is a ratio of two signal measures. Accordingly, if at step 302 the initially sampled signal is an input signal and the signal subsequently sampled is the reflection of that signal, then the method can be used to determine $S_{11}$. Alternatively, if the signal initially sampled at step 302 is an input signal to the DUT the signal subsequently sampled at step 306 is an output signal from the DDT, then either $S_{21}$ or $S_{12}$ can be determined. If, instead, the signal initially sampled at step 302 is a signal to the DUT via an output port and the signal subsequently sampled at step 306 is the reflection of that signal from the DUT, then the s-parameter $S_{22}$ can be determined.

More particularly, according to one embodiment, each portion of the signals sampled initially at step 302 and subsequently at 306 can be sampled using a directional coupler, as described above. The sampled portions of the signal, moreover, can be conveyed via switch to a divider and on to the peak and phase detectors as also described above, according to still another embodiment.

A typical usage of the present invention is for verification of the microwave functionality of an IC, determined in a manufacturing parts test environment. The testing could be performed, for example, in connection with a wireless local area network (WLAN) device, a cellular phone, or other type of communications or wireless computing device.

Figure 4:
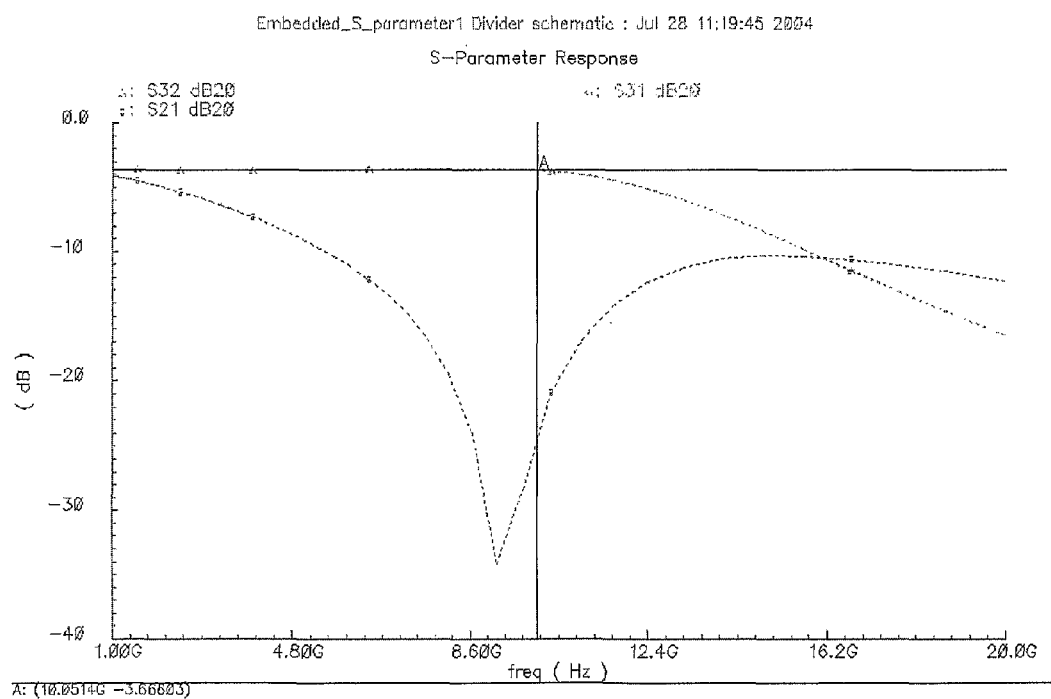
FIG. 4 is a plot in decibels versus frequency of the simulation result for the divider for an on-chip s-parameter measurement device, according to one embodiment of the present invention.
Figure 5:
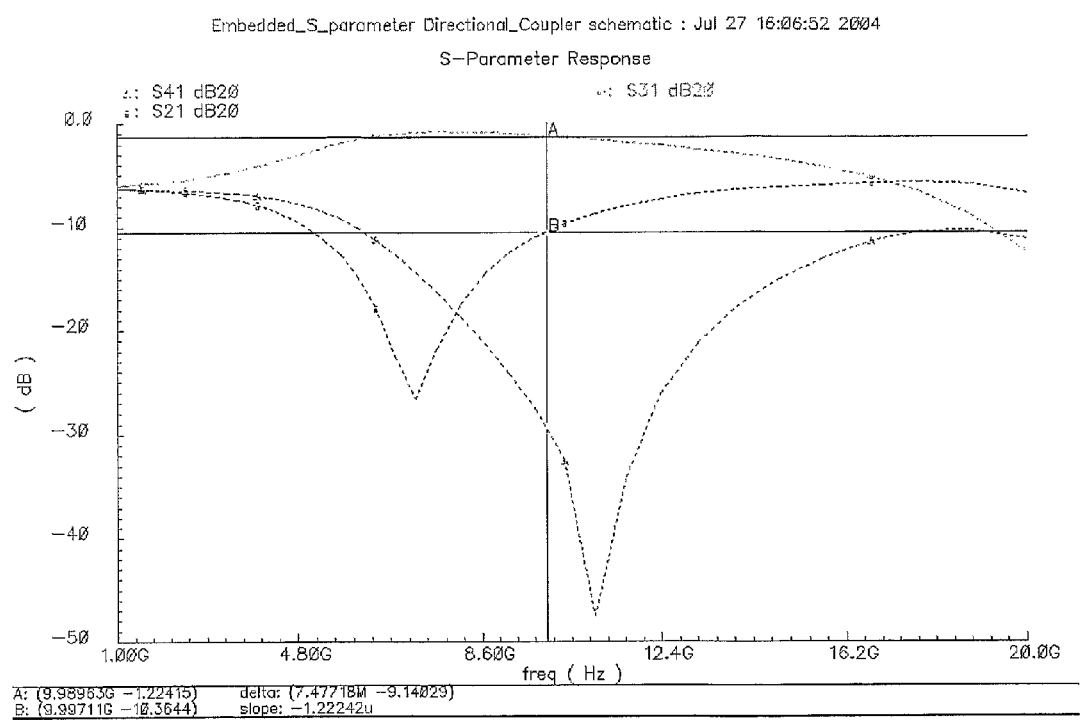
FIG. 5 is a plot in decibels versus frequency of the simulation results for the directional coupler for an on-chip s-parameter measurement device, according to one embodiment of the present invention.
Figure 6:
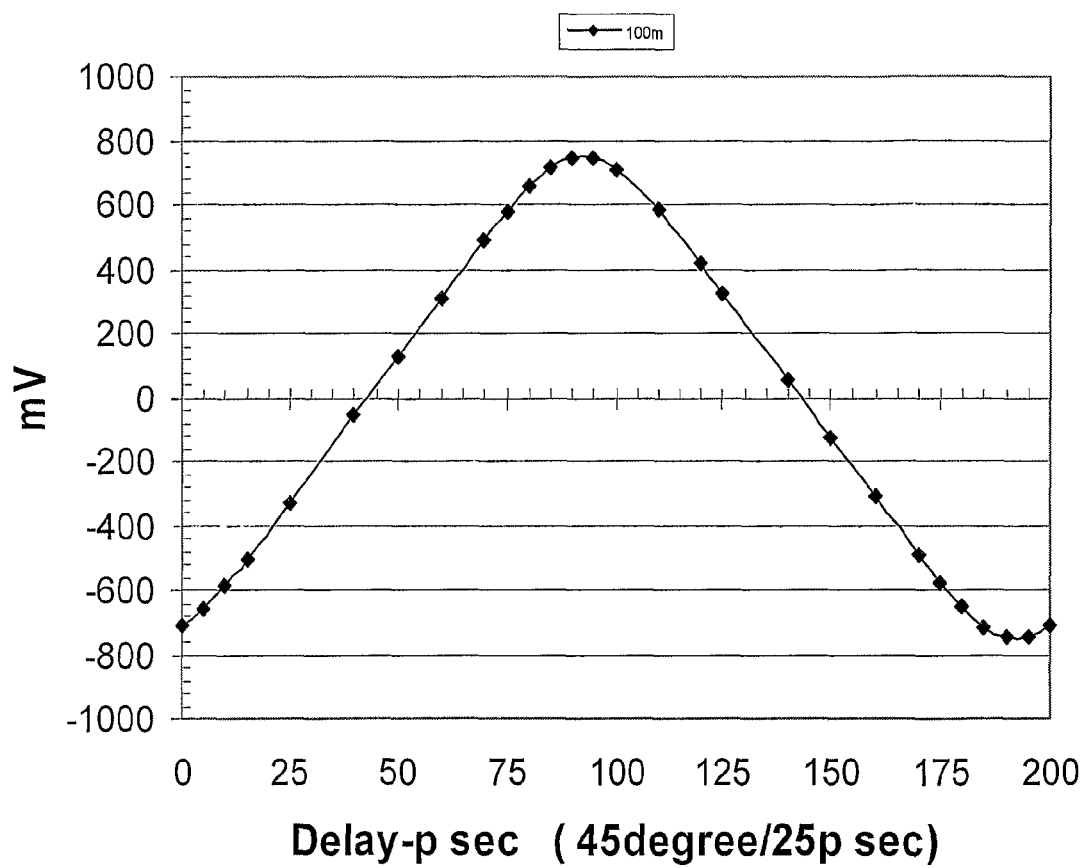
FIG. 6 is plot in decibels versus frequency of the simulation results of the phase detector for an on-chip s-parameter measurement device according to one embodiment of the present invention.

FIGS. 4-6 are plots of simulation results obtained by the inventors. In particular, FIG. 4 gives the simulation result (in decibels) of the divider for an on-chip s-parameter measurement device according to the present invention. FIG. 5 gives the simulation result (in decibels) of the directional coupler. FIG. 6 gives the simulation result of the Gilbert cell phase detector electrically connected to the directional coupler.

Figure 7:
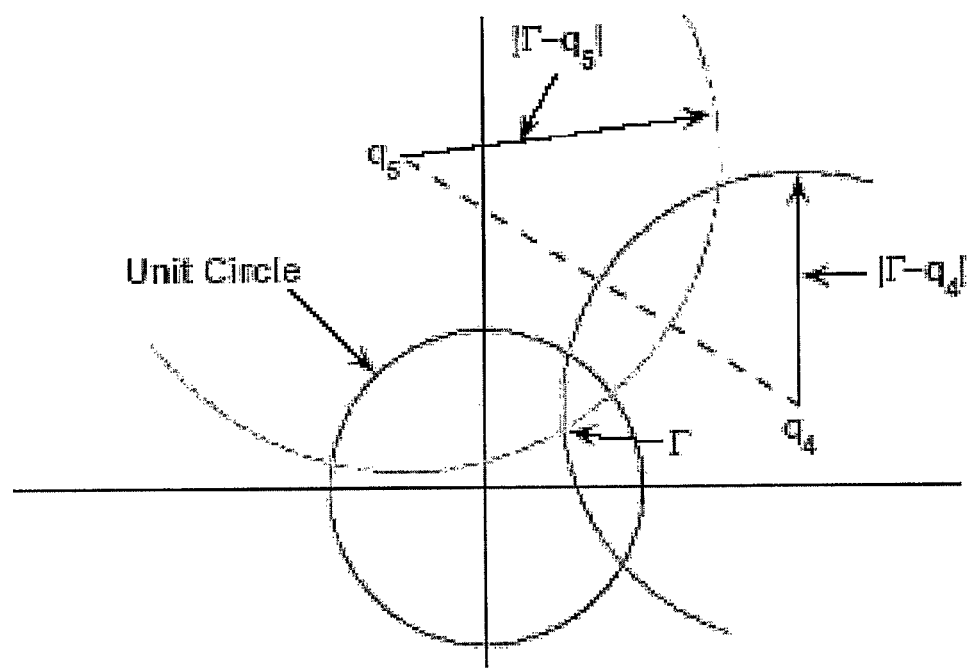
FIG. 7 a graphical representation of the determination of a reflection coefficient, F, by a compact, on-chip s-parameter measuring device for RF/microwave testing, according to yet another embodiment of the present invention.

Yet another embodiment of the present invention is a compact s-parameter measuring device implemented as an on-chip six-port reflectometer. Such a device measures the reflection coefficient Γ of a device by feeding a signal from a RF signal source to the input port of the six-port structure. The output measuring port can be connected with the device under test (DDT). With such a configuration, four power detectors are placed on the strategically placed four ports for the extraction of reflection coefficient Γ. Through some derivation, the reflection coefficient Γ is obtained from the intersection of three circles, as graphically illustrated in FIG. 7.

Figure 8:
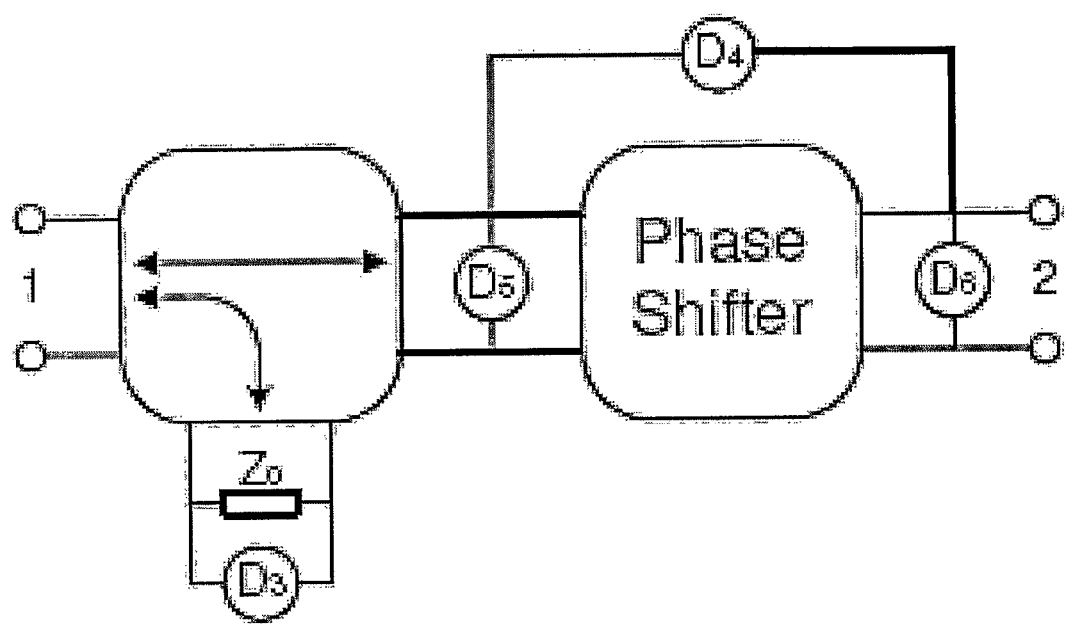
FIG. 8 is a schematic diagram of a compact, on-chip s-parameter measuring device for RF/microwave testing, according to yet another embodiment of the present invention.

Referring now to FIG. 8, a compact, on-chip s-parameter measuring device 800 for RF/microwave testing, according to a particular embodiment of the present invention, is schematically illustrated. As shown, the s-parameter measuring device 800 has a six-port structure. The on-chip s-parameter measuring device 800 illustratively includes a power divider 802 that leads a part of incident power from the source at port 1 to the matched reference power detector D3 at port 3, followed by a phase shifter 804 which is surrounded by three power detectors D4, D5, and D6 each having a high input impedance.

Figure 9:
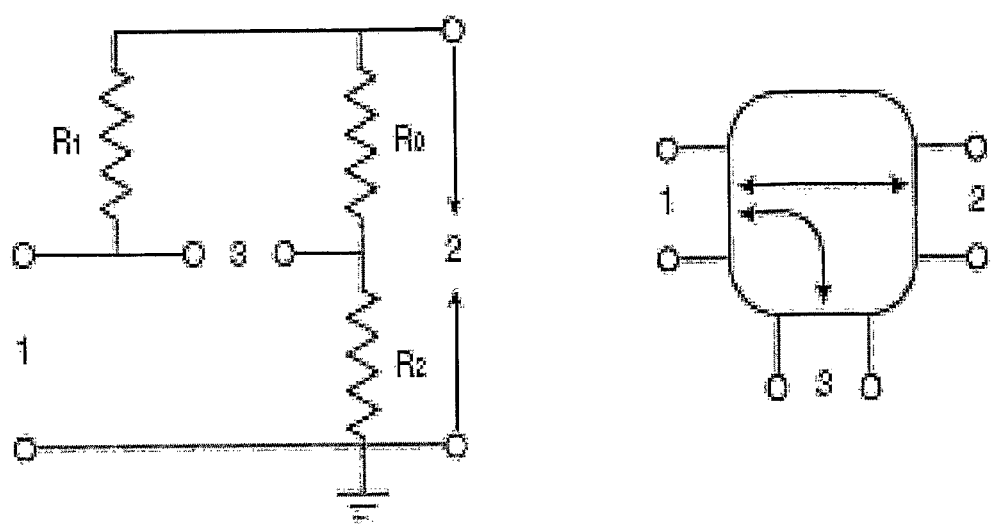
FIG. 9 is a schematic diagram of an electric circuit implementation of a resistive power divider used in a compact, on-chip s-parameter measuring device according to one embodiment of the present invention.

The power divider 802 can have a resistive structure similar to that of a Wheatstone bridge. Referring additionally to FIG. 9, an electronic circuit implementation of the resistive power divider 802 according to one embodiment is shown. The resistive power divider 802 requires a much smaller chip area than that of its reactive counterpart. Accordingly, the resistive power divider can effectively and efficiently be used for embedded testing.

Figure 10:
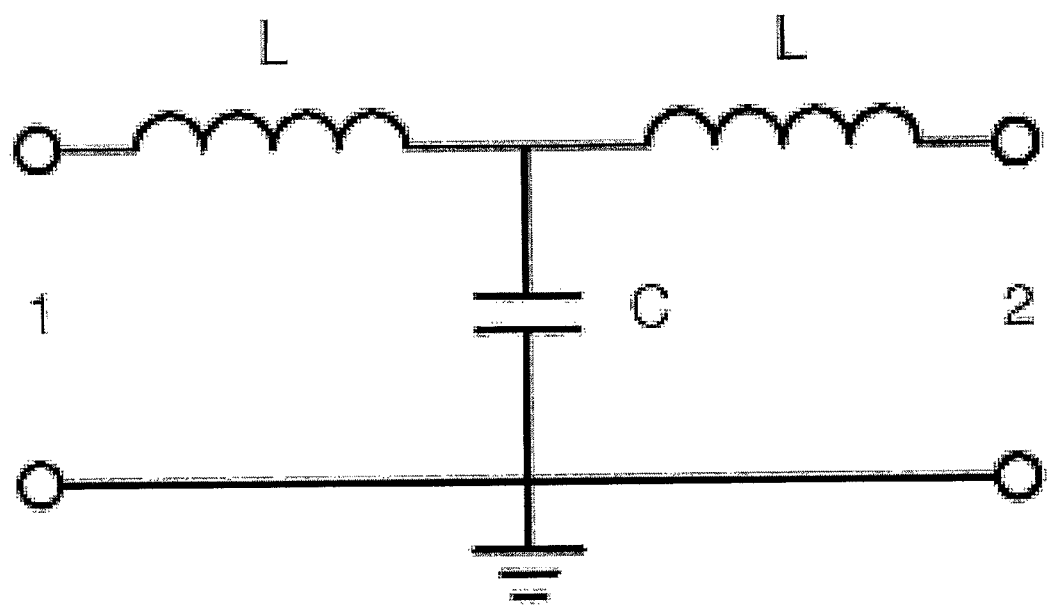
FIG. 10 is a schematic diagram of an electric circuit implementation of a T-type phase shifter used in the compact, on-chip s-parameter measuring device according to another embodiment of the present invention.

Referring also to FIG. 10, a T-type version of the phase shifter 804, according to one particular embodiment, is schematically illustrated. As shown, the phase shifter has two series inductors and one capacitor shunt to ground. The phase shifter can achieve a 60° phase shift at a specific frequency. Even though the phase of the phase shifter varies with frequency, the six-port techniques can still work well in a considerable bandwidth, the bandwidth specifically being sufficient for embedded testing.

Figure 11:
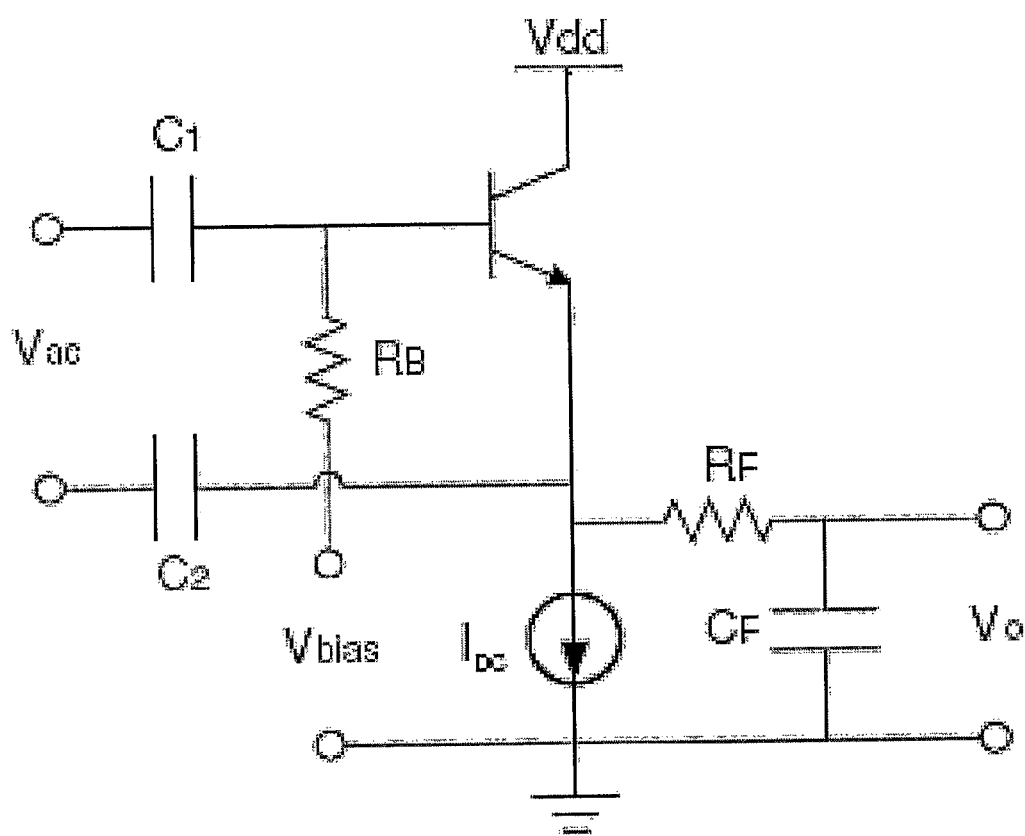
FIG. 11 is a schematic diagram of an implementation of the detector used in the compact, on-chip s-parameter measuring device according to still another embodiment of the present invention.

Referring additionally to FIG. 11, an implementation of the detector, D4, of the s-parameter measuring device, according to one embodiment, is schematically illustrated. The four-power detector design is a unique feature of the s-parameter measuring device. The detector D4, according to this particular embodiment, is implemented as a bipolar differential detector, as shown. A differential signal is fed into the base and emitter of the bipolar junction transistor and then rectified to produce a DC output signal through a low-pass filter.

Figure 12:
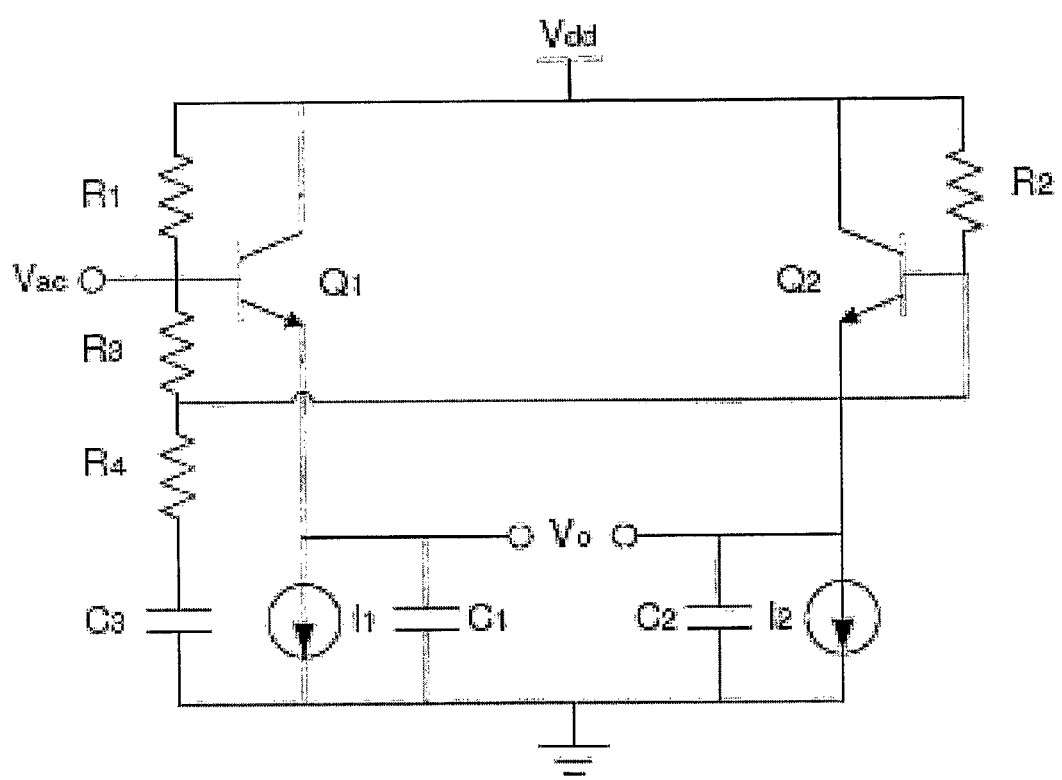
FIG. 12 is a schematic diagram of a matched voltage-divider enhanced detector for implementing a detector used in the compact, on-chip s-parameter measuring device according to yet another embodiment of the present invention.
Figure 13:
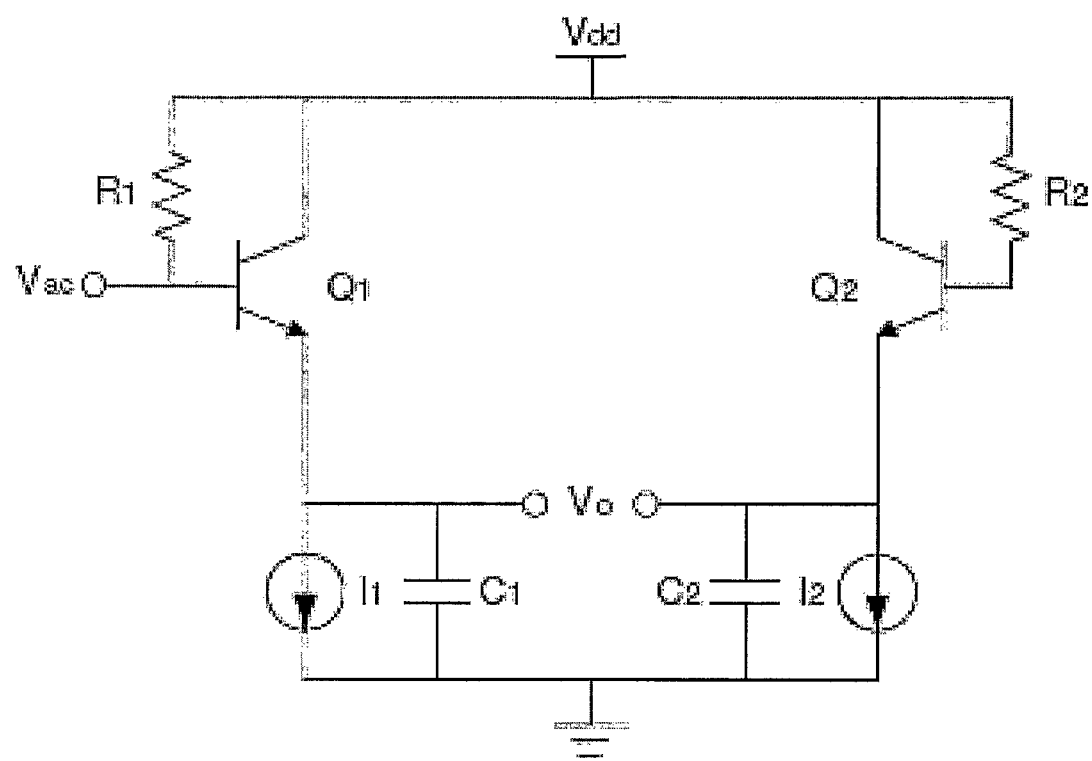
FIG. 13 is a schematic diagram of a Meyer detector for implementing a detector used in the compact, on-chip s-parameter measuring device according to still another embodiment of the present invention.

The detector D3 can be implemented by either a matched voltage-divider enhanced detector as illustrated in FIG. 12, or alternatively, by matched Meyer detector as illustrated in FIG. 13. The detectors D5 and D6 can each be implemented with the unmatched Meyer detector. The on-chip s-parameter measuring device implemented as a six-port detector can be embodied in other forms so as to include additional ports and power detectors. Accordingly, the s-parameter measuring device can be implemented so as to provide a reflectometer having a very wide range of frequency detection.

This invention can be embodied in other forms without departing from the spirit or essential attributes thereof. Accordingly, reference should be made to the following claims, rather than to the foregoing specification, as indicating the scope of the invention.

That claimed is:

1. An embedded s-parameter measurement system for measuring or determining an s-parameter, the system comprising:
    an s-parameter test circuit for connecting to a port of a high-frequency multi-port device-under-test (DUT), the s-parameter test circuit being embedded on-chip with the DUT and including:
        a directional coupler for sampling a forward signal at RF or microwave frequencies conveyed to the DUT and for sampling a reverse signal at RF or microwave frequencies reflected by the DUT, wherein the directional coupler connects to the DUT without a cable or external connector,
        a peak detector electrically connected without a cable or external connector to the directional coupler for directly detecting a magnitude of a signal at the RF or microwave frequencies of the reverse signal reflected by the DUT conveyed to the peak detector by the directional coupler, and
        a phase detector electrically connected without a cable or external connector to the directional coupler for determining a phase of a signal at the RF or microwave frequencies of the reverse signal reflected by the DUT conveyed to the phase detector by the directional coupler; and
    at least one other s-parameter test circuit for connecting to another port of the high-frequency multi-port DUT, the at least one other s-parameter test circuit being embedded on-chip with the DUT.

2. The system of claim 1, wherein the directional coupler comprises a forward coupling port and a reverse coupling port.

3. The system of claim 1, wherein the s-parameter test circuit further comprises a divider electrically coupled between the directional coupler and each of the peak detector and phase detector.

4. The system of claim 1, wherein the s-parameter test circuit further comprises a switch electrically coupled between the directional coupler and each of the peak detector and phase detector.

5. The system of claim 1, wherein the s-parameter test circuit further comprises a switch and a divider electrically connected thereto, the switch being directly connected to the directional coupler and the divider being directly connected to each of the peak detector and phase detector.

6. The system of claim 5, wherein the switch comprises a double pull, double throw switch.

7. The system of claim 1, wherein the system comprises a high-frequency system.

8. The system of claim 1, wherein the at least one other s-parameter test circuit comprises:
    an additional directional coupler for sampling a forward signal conveyed from the DUT and for sampling a reverse signal reflected by the DUT, an additional peak detector electrically connected to the additional directional coupler for detecting a magnitude of a signal conveyed to the additional peak detector by the additional directional coupler, and an additional phase detector electrically connected to the additional directional coupler for determining a phase of a signal conveyed to the additional phase detector by the additional directional coupler.

9. The system of claim 1, wherein the phase detector comprises a Gilbert Cell.

10. The system of claim 1, wherein the peak detector comprises a matched voltage-divider enhanced detector or a matched Meyer detector.

11. A s-parameter test circuit embedded on-chip with a device-under-test (DUT), the circuit comprising:

a directional coupler for sampling a forward signal at RF or microwave frequencies conveyed to the DUT and for sampling a reverse signal at RF or microwave frequencies reflected by the DUT;

a peak detector electrically connected without a cable or external connector to the directional coupler for directly detecting a magnitude of a signal at the RF or microwave frequencies of the reverse signal reflected by the DUT conveyed to the peak detector by the directional coupler; and a phase detector electrically connected without a cable or external connector to the directional coupler for determining a phase of a signal at the RF or microwave frequencies of the reverse signal reflected by the DUT conveyed to the phase detector by the directional coupler.

12. The circuit of claim 11, further comprising a divider electrically coupled between the directional coupler and each of the peak detector and phase detector.

13. The circuit of claim 11, further comprising a switch electrically coupled between the directional coupler and each of the peak detector and phase detector.

14. The circuit of claim 13, wherein the switch comprises a double pull, double throw switch.

15. The circuit of claim 11, further comprising a switch and a divider electrically connected thereto, the switch being directly connected to the directional coupler and the divider being directly connected to each of the peak detector and phase detector.

16. The system of claim 11, wherein the phase detector comprises a Gilbert Cell.

17. The system of claim 11, wherein the peak detector comprises a matched voltage-divider enhanced detector or a matched Meyer detector.

18. A method of determining or measuring a s-parameter using a s-parameter test circuit embedded on-chip with a device-under-test (DUT), the method comprising:

sampling a portion of a signal at RF or microwave frequencies conveyed to the DUT without using a cable or external connector;

conveying the sampled portion of the signal to a peak detector and a phase detector without using a cable or external connector;

sampling at least one of a signal at RF or microwave frequencies conveyed from the DUT and a signal at RF or microwave frequencies reflected by the DUT without using a cable or external connector;

conveying, without using a cable or external connector, the sampled portion of the signal conveyed from the DUT when the signal is conveyed from the DUT and sampled; and conveying, without using a cable or external connector, the sampled portion of the signal reflected by the DUT when the signal is reflected by the DUT, wherein the peak detector and phase detector measure or determine magnitude and phase directly at the RF or microwave frequencies of the DUT.

19. The method of claim 18, wherein sampling a portion of a signal comprises sampling at least one signal using a directional coupler.

20. The method of claim 18, wherein conveying comprises conveying at least one signal to a switch.

21. The method of claim 18, wherein conveying comprises conveying at least one signal to a divider.

22. The method of claim 18, wherein conveying comprises conveying at least one signal to a divider via a switch connected between the divider and a directional coupler.

23. The method of claim 18, wherein the phase detector comprises a Gilbert Cell.

24. The method of claim 18, wherein the peak detector comprises a matched voltage-divider enhanced detector or a matched Meyer detector.

* * * * *

UNITED STATES PATENT AND TRADEMARK OFFICE
CERTIFICATE OF CORRECTION

| | |
|---|---|
| PATENT NO. | : 7,924,025 B2 |
| APPLICATION NO. | : 11/996913 |
| DATED | : April 12, 2011 |
| INVENTOR(S) | : William R. Eisenstadt et al. |

It is certified that error appears in the above-identified patent and that said Letters Patent is hereby corrected as shown below:

Column 3,
Line 48, "coefficient, F, by a" should read --coefficient, $\Gamma$, by a--.

Column 5,
Lines 5-6, "coefficient Operatively" should read --coefficient $S_{11}$. Operatively--.

Column 6,
Line 35, "206h" should read --206b--.
Line 57, "DUT the" should read --DUT and the--.
Line 59, "DDT" should read --DUT--.

Column 7,
Line 23, "(DDT)" should read --(DUT)--.

Signed and Sealed this
Twelfth Day of July, 2011

David J. Kappos
*Director of the United States Patent and Trademark Office*